United States Patent
Iwasaki et al.

(10) Patent No.: US 8,467,148 B2
(45) Date of Patent: Jun. 18, 2013

(54) SPIN TORQUE OSCILLATOR, MAGNETIC RECORDING HEAD, MAGNETIC HEAD ASSEMBLY AND MAGNETIC RECORDING APPARATUS

(75) Inventors: Hitoshi Iwasaki, Kanagawa-ken (JP); Soichi Oikawa, Tokyo (JP); Katsuhiko Koui, Kanagawa-ken (JP); Kenichiro Yamada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 914 days.

(21) Appl. No.: 12/588,176

(22) Filed: Oct. 6, 2009

(65) Prior Publication Data
US 2010/0142088 A1 Jun. 10, 2010

(30) Foreign Application Priority Data
Oct. 6, 2008 (JP) .................. 2008-260043

(51) Int. Cl.
*G11B 5/127* (2006.01)
(52) U.S. Cl.
USPC .......................................... 360/110
(58) Field of Classification Search
USPC .......................................... 360/110
See application file for complete search history.

(56) References Cited

U.S. PATENT DOCUMENTS

| | | | |
|---|---|---|---|
| 6,011,664 A | 1/2000 | Kryder et al. | |
| 6,153,062 A | 11/2000 | Saito et al. | |
| 6,583,969 B1 | 6/2003 | Pinarbasi | |
| 6,785,092 B2 | 8/2004 | Covington et al. | |
| 6,982,845 B2 | 1/2006 | Kai et al. | |
| 7,466,525 B2 * | 12/2008 | Hasegawa et al. | 360/324.12 |
| 7,471,491 B2 | 12/2008 | Sato et al. | |
| 7,532,433 B2 | 5/2009 | Kawato et al. | |
| 7,593,185 B2 | 9/2009 | Yazawa | |
| 7,616,412 B2 | 11/2009 | Zhu et al. | |
| 2004/0150912 A1 | 8/2004 | Kawato et al. | |
| 2005/0023938 A1 | 2/2005 | Sato et al. | |
| 2005/0110004 A1 | 5/2005 | Parkin et al. | |
| 2005/0219771 A1 | 10/2005 | Sato et al. | |

(Continued)

FOREIGN PATENT DOCUMENTS

| | | |
|---|---|---|
| JP | 2005-525663 | 8/2005 |
| JP | 2005-285242 | 10/2005 |

(Continued)

OTHER PUBLICATIONS

S. Maat et al.; "Magnetotransport properties and spin-torque effects in current perpendicular to the plane spin valves with Co-Fe-Al magnetic layers"; Journal of Applied Physics 101, 093905 (2007).

(Continued)

*Primary Examiner* — Julie Anne Watko
(74) *Attorney, Agent, or Firm* — Nixon & Vanderhye, P.C.

(57) ABSTRACT

A spin torque oscillator includes an amorphous soft magnetic layer, a nonmagnetic layer and a hard magnetic layer. The nonmagnetic layer with a close-packed crystal structure is provided on the amorphous soft magnetic layer. The hard magnetic layer with a close-packed crystal structure and perpendicular magnetic anisotropy is provided on the nonmagnetic layer.

13 Claims, 13 Drawing Sheets

U.S. PATENT DOCUMENTS

| | | | |
|---|---|---|---|
| 2007/0063237 A1* | 3/2007 | Huai et al. | 257/295 |
| 2007/0171694 A1 | 7/2007 | Huai et al. | |
| 2008/0019040 A1* | 1/2008 | Zhu et al. | 360/110 |
| 2008/0112087 A1 | 5/2008 | Clinton et al. | |
| 2008/0137224 A1 | 6/2008 | Gao et al. | |
| 2008/0304176 A1 | 12/2008 | Takagishi et al. | |
| 2009/0052095 A1 | 2/2009 | Yamada et al. | |
| 2009/0059417 A1 | 3/2009 | Takeo et al. | |
| 2009/0059423 A1 | 3/2009 | Yamada et al. | |
| 2009/0080105 A1 | 3/2009 | Takashita et al. | |
| 2009/0080106 A1 | 3/2009 | Shimizu et al. | |
| 2009/0080120 A1 | 3/2009 | Funayama et al. | |
| 2009/0097167 A1 | 4/2009 | Sato et al. | |
| 2009/0097169 A1 | 4/2009 | Sato et al. | |
| 2009/0225465 A1 | 9/2009 | Iwasaki et al. | |
| 2009/0257151 A1 | 10/2009 | Zhang et al. | |
| 2010/0027161 A1* | 2/2010 | Takagishi et al. | 360/110 |
| 2012/0170151 A1* | 7/2012 | Oikawa et al. | 360/110 |

FOREIGN PATENT DOCUMENTS

| | | | |
|---|---|---|---|
| JP | 2006-080385 | | 3/2006 |
| JP | 2006-244693 | | 9/2006 |
| JP | 2006244693 A | * | 9/2006 |
| JP | 2008-123669 | | 5/2008 |

OTHER PUBLICATIONS

X. Zhu et al.; "Bias-Field-Free Microwave Oscillator Driven by Perpendicularly Polarized Spin Current"; IEEE Transactions on Magnetics, vol. 42, No. 10, Oct. 2006.

Jian-Gang Zhu et al.; "Microwave Assisted Magnetic Recording (MAMR)"; The Magnetic Recording Conference (TMRC2007), May 2007, pp. 34-35.

Office Action dated Sep. 28, 2012 in JP Application No. 2008-260043 with English-language translation.

* cited by examiner

SPIN TORQUE OSCILLATOR, MAGNETIC RECORDING HEAD, MAGNETIC HEAD ASSEMBLY AND MAGNETIC RECORDING APPARATUS

CROSS REFERENCE TO RELATED APPLICATION

This application is based upon and claims the benefit of priority from the Japanese Patent Application No. 2008-260043, filed on Oct. 6, 2008, the entire contents of which are incorporated herein by reference.

FIELD OF THE INVENTION

The present invention relates to a spin torque oscillator, a magnetic recording head, a magnetic head assembly, and a magnetic recording apparatus.

DESCRIPTION OF THE BACKGROUND

In the 1990s, the practical application of an MR (Magneto-Resistive effect) head and a GMR (Giant Magneto-Resistive effect) head has contributed to the skyrocketing of the recording density and capacity of an HDD (Hard Disk Drive). However, since the problem of heat fluctuation of a magnetic recording medium became conspicuous in the early 2000s, the speed of the increase in recording density slowed down temporarily. Even so, a perpendicular magnetic recording was put in practical use in 2005, the perpendicular magnetic recording being more advantageous to high density recording theoretically than an longitudinal magnetic recording. This event triggers a recent growth rate of 40% for the recording density of an HDD.

According to a latest demonstration experiment for an HDD, 400 Gbits/inch$^2$ has been attained. If this trend continues strongly, a recording density of 1 Tbits/inch$^2$ is expected to be attained around 2012. However, it will not be easy to attain such a high recording density even employing the perpendicular magnetic recording, because the problems of heat fluctuation will still become conspicuous.

A "high-frequency magnetic field assist recording method" is proposed as a recording method which can solve this problem (U.S. Pat. No. 6,011,664). In the high-frequency magnetic field assist recording method, the magnetic field with a frequency sufficiently higher than a recording signal frequency near the resonant frequency of a magnetic recording medium is locally applied to the medium. As a result, the medium resonates, and a portion of the medium, to which the high frequency magnetic field is applied, has a coercive force half or less than that of the medium without any field applied thereto. According to this effect, it is possible to write into a magnetic recording medium with a higher coercive force and higher anisotropy energy (Ku) by superimposing the high frequency magnetic field onto the recording field thereof. However, the method employs a coil to generate the high frequency magnetic field, making it difficult to efficiently apply the high frequency magnetic field to the medium.

Consequently, a method employing a spin torque oscillator has been proposed (for example, USPA20050023938, USPA20050219771, USPA20080019040, IEEE Trans. On Magn., Vol. 42, No. 10, PP. 2670). In the method disclosed, the spin torque oscillator includes a spin injection layer, a nonmagnetic layer, a magnetic layer and electrodes. A direct current is passed through the spin torque oscillator via the electrodes to cause ferromagnetic resonance of magnetization in the magnetic layer, the ferromagnetic resonance being due to spin torque by spin injection. As a result, the spin torque oscillator generates the high frequency magnetic field.

Since the spin torque oscillator is about tens of nm in size, the high frequency magnetic field generated localizes in an area of about tens of nm near the spin torque oscillator. Furthermore, the in-plane component of the high frequency magnetic field allows it to cause the ferromagnetic resonance in a perpendicularly magnetized medium and to substantially reduce the coercive force of the medium. As a result, a high-density magnetic recording is performed only in a superimposed area of a recording field generated from a magnetic pole and the high frequency magnetic field generated from the spin torque oscillator. This allows it to use a medium with a high coercive force (Hc) and high anisotropy energy (Ku). For this reason, the problem of heat fluctuation can be avoided at the time of high density recording.

In order to make a recording head for the high-frequency magnetic field assist recording, it becomes important to design and produce the spin torque oscillator capable of providing a stable oscillation with a low driving current and generating an in-plane high-frequency magnetic field to sufficiently cause a magnetic resonance of the magnetization in the medium.

A maximum current density which can be passed through the spin torque oscillator is $2\times10^8$ A/cm$^2$, for example when the oscillator is about 70 nm in size. The current density beyond this value deteriorates the characteristic of the spin torque oscillator, e.g., owing to heating and electromigration thereof. For this reason, it is important to design a spin torque oscillator capable of oscillating with a current density as low as possible.

On the other hand, the literature discloses a criterion to fully cause a magnetic resonance of the medium magnetization. That is, it is desirable to make the intensity of the in-plane high frequency magnetic field not less than 10% of the anisotropy field (Hk) of the medium (see, for example, TMRC B6 (2007), "Microwave Assisted Magnetic Recording (MAMR)"). In order to increase the intensity of the in-plane high frequency magnetic field, the following items are required:
1) Increasing the saturation magnetization of an oscillation layer;
2) Increasing the thickness of the oscillation layer; and
3) Increasing a deflection angle of a precession motion of the magnetization in the oscillation layer, the deflection angle being defined as an angle between the magnetization and an external magnetic field.

However, all the items give rise to an increase in the driving current.

There exists trade-off between lowering the driving current density and increasing the intensity of the in-plane high frequency magnetic field. It is desirable to develop a spin torque oscillator capable of realizing a lower driving current density and the higher intensity of the in-plane high frequency magnetic field simultaneously.

USPA20050110004 discloses an example employing an FeCoAl alloy as a material of the free layer in a longitudinal magnetization memory with TMR. USPA20070063237 discloses an example employing a Heusler alloy. FeCoAl was also employed in a longitudinal magnetization CPP-GMR head (J. of Appl. Phys., Vol. 101, P. 093905 (2007)).

USPA20080137224 discloses an example employing CoFeB for a spin injection layer and an oscillation layer.

SUMMARY OF THE INVENTION

According to a first aspect of the invention, a spin torque oscillator includes an amorphous soft magnetic layer, a nonmagnetic layer and a hard magnetic layer. The nonmagnetic layer is provided between the soft magnetic layer and the hard magnetic layer, and has a close packing structure arranged on the amorphous soft magnetic layer. The hard magnetic layer has a close packing structure and perpendicular magnetic anisotropy.

According to a second aspect of the invention, another spin torque oscillator includes a crystalline soft magnetic layer, an amorphous layer, a nonmagnetic layer and a hard magnetic layer. The amorphous layer is arranged on the crystalline soft magnetic layer. The hard magnetic layer has a close packing structure and perpendicular magnetic anisotropy. The nonmagnetic layer is provided between the soft magnetic layer and the hard magnetic layer, and has a close packing structure arranged on the amorphous layer.

According to a third aspect of the invention, a magnetic recording head includes a spin torque oscillator according to the first aspect of the invention and a magnetic pole provided near the spin torque oscillator.

According to a fourth aspect of the invention, a magnetic head assembly includes the magnetic recording head, a head slider, a suspension and an actuator arm. The magnetic recording head includes a spin torque oscillator. The spin torque oscillator includes an amorphous soft magnetic layer, a hard magnetic layer having close packing structure and perpendicular magnetic anisotropy, and a nonmagnetic layer provided between the soft magnetic layer and the hard magnetic layer, and having close packing structure arranged on the amorphous soft magnetic layer. The magnetic pole is provided near the spin torque oscillator. The head slider is installed in the magnetic recording head. The suspension is equipped with the head slider in an end thereof. The actuator arm is connected with the other end of the suspension.

According to a fifth aspect of the invention, a magnetic recording apparatus includes a magnetic recording medium, the magnetic head assembly and a signal processing portion. The magnetic head assembly includes a magnetic recording head. The magnetic recording head includes the spin torque oscillator including an amorphous soft magnetic layer, a hard magnetic layer having close packing structure and perpendicular magnetic anisotropy, and a nonmagnetic layer provided between the soft magnetic layer and the hard magnetic layer, and having close packing structure arranged on the amorphous soft magnetic layer. The magnetic pole is provided near the spin torque oscillator. The head slider is installed in the magnetic recording head. The suspension is equipped with the head slider in an end thereof. The actuator arm is connected with the other end of the suspension. The signal processing unit is configured to write signals on the magnetic recording medium or read out from the magnetic recording medium by using the magnetic recording head.

BRIEF DESCRIPTION OF DRAWINGS

The accompanying drawings, which are incorporated in and constitute a part of this specification, illustrate embodiments of the invention and together with the description, serve to explain the principles of the invention.

DETAILED DESCRIPTION OF THE EMBODIMENTS

Figure 1:
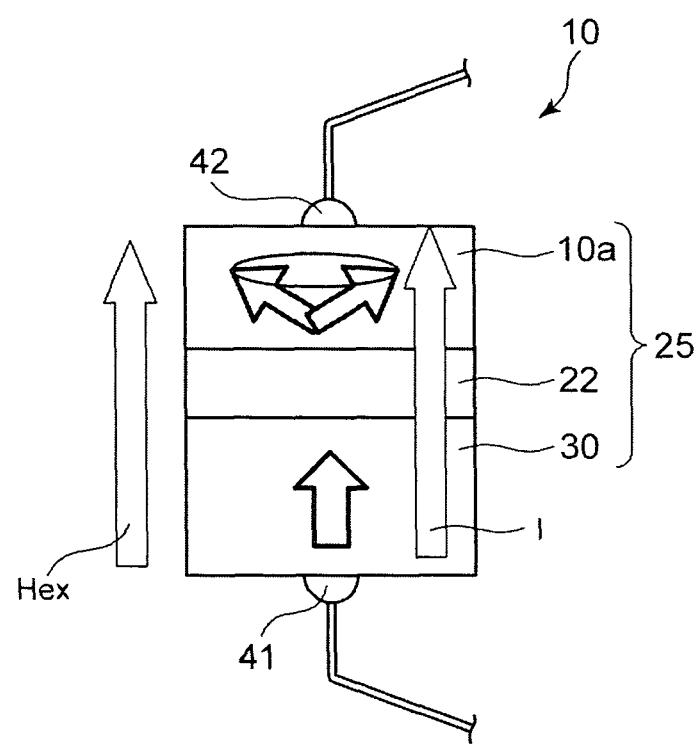
FIG. 1 is a sectional view illustrating a configuration of a spin torque oscillator according to a first embodiment of the present invention.

Embodiments of the present invention are explained below with reference to accompanying drawings. The drawings are conceptual. Therefore, a relationship between the thickness and width of each portion and a proportionality factor among respective portions are not necessarily the same as an actual thing. Even when the same portions are drawn, their sizes or proportionality factors are represented differently from each other with respect to the drawings. The embodiments of the invention will be described below with reference to accompanying drawings. Wherever possible, the same reference numerals will be used to denote the same or like portions throughout the detailed description and the figures.

First Embodiment

FIG. 1 is a sectional view illustrating a configuration of a spin torque oscillator according to a first embodiment of the present invention. As shown in FIG. 1, a spin torque oscillator 10 according to the first embodiment of the invention has a laminated structure 25 which is provided with an oscillation layer (amorphous soft magnetic layer) 10a, a spin injection layer (hard magnetic layer) 30, and a nonmagnetic layer 22 disposed between the oscillation layer 10a and the spin injection layer 30.

The spin torque oscillator 10 may have a pair of electrodes through which a current can be passed in the laminated direction of the laminated structure 25, i.e., a first electrode 41 and a second electrode 42. That is, a driving current I is passed through the laminated structure 25 via the first electrode 41 and the second electrode 42.

However, one of these first and second electrodes 41, 42 at least may double as a main pole and a return path (shield), etc. of a magnetic recording head described later. In this case, one of the first and second electrodes 41, 42 at least, may be omitted in the spin torque oscillator 10. The spin torque oscillator 10 is explained as an example having the first and second electrodes 41, 42 below.

As shown in FIG. 1, an external magnetic field Hex is applied to the laminated structure 25.

In the spin torque oscillator 10 according to this embodiment, an oscillation layer 10a includes an Fe—Co—B alloy. That is, the spin torque oscillator 10 is provided with the amorphous soft magnetic layer 10a, a nonmagnetic layer 22 with a close-packed crystal structure which is disposed on the amorphous soft magnetic layer, and a hard magnetic layer 30 with a close-packed crystal structure and perpendicular anisotropy which is disposed on the nonmagnetic layer. Alternatively, the spin torque oscillator 10 has the oscillation layer 10a (the amorphous soft magnetic layer 10a) which may consist of just one magnetic layer including an Fe—Co—B alloy. Alternatively, the oscillation layer 10a (the amorphous soft magnetic layer 10a) may consist of two or more layers, one of the two or more layers including an Fe—Co—B alloy. The Fe—Co—B alloy is referred to as the "FeCoB alloy" in some cases in this detailed description.

The spin torque oscillator 10 is formed on a proper substrate or an underlayer not shown in the figure, and is separated from other circuits using insulators such as alumina, $SiO_2$, etc. not shown in the figure.

Materials, which are hard to be oxidized and have low resistances, such as Ti, Cu, etc. may be employed for the first and second electrodes 41, 42. It is preferable to provide Cu at the interface between the first electrode 41 and the amorphous soft magnetic layer 10a. This is because the Cu interface allows it to prevent B atoms contained in the amorphous soft magnetic layer 10a from diffusing into the first electrode 41.

A Fe—Co—B alloy with a boron composition ratio of 10 atomic % or more is amorphous to be obtained, independently of the composition ratio of Fe to Co. Hereinafter, "atomic %" is denoted as "at. %". The Fe—Co—B alloy with the following composition is employed for the oscillation layer 10a of the spin torque oscillator 10 according to the present embodiment. The ratios (Fe:Co) of Fe and Co is 50 at. % and 50 at. %, and the ratios (FeCo:B) of CoFe and B is 75 at. % and 25 at. %. The ratios mentioned above is represented hereinafter as "$(Fe_{50at.\%}Co_{50at.\%})_{75at.\%}B_{25at.\%}$". The saturation magnetization of this material is 1000 emu/cc. The layer thickness of this oscillation layer 10a is 12 nm. And, a Cu layer with a layer thickness of 3 nm is employed for the nonmagnetic layer 22. On the other hand, an alloy ($Co_{80at.\%}Pt_{20at.\%}$ alloy) with the ratios of Co and Pt being 80 at. %: 20 at. % is employed for the spin injection layer with a layer thickness of 20 nm.

This $Co_{80at.\%}Pt_{20at.\%}$ alloy has a close-packed hexagonal structure and the largest crystal magnetic anisotropy among CoPt alloys. When a close-packed plane (00.1) is formed to be parallel to a laminated layer of the laminated structure, a direction perpendicular to the laminated layer coincides with an easy magnetization axis, perpendicular magnetic anisotropy being obtained in the easy axis. The CoPt alloy is known to have a close-packed hexagonal structure in the range of 0 to 20 at. % of Pt ratio. In the range, the alloy is also known to have large uniaxial crystal magnetic anisotropy and anisotropy field, being suitable for the spin injection layer of the spin torque oscillator.

In a range where Pt ratio is beyond 20 at. %, the CoPt ally is apt to have a face-centered cubic structure, the uniaxial crystal magnetic anisotropy and anisotropy field being apt to decrease. In the present embodiment, Pt ratio is preferably in the range of 10 to 30 at. %, and is more preferably in the range of 15 to 20 at. %. The spin torque oscillator 10 has a square with 70 nm on a side.

However, the spin torque oscillator 10 according to this embodiment may have not only the above-mentioned materials and layer thickness, but also various kinds of materials and another layer thickness.

For example, materials with long spin diffusion length and a face-centered cubic structure, such as Cu, Au, Ag, etc. may be employed for the nonmagnetic layer 22. The thickness of the nonmagnetic layer 22 is preferably from one atomic layer to 3 nm from the view point of magnetic interaction between the oscillation layer 10a and the spin injection layer. However, when the nonmagnetic layer 22 is made thin, the crystallinity of the nonmagnetic layer 22 lowers, and then the crystallinity of the hard magnetic layer 30 thereon also lower and it gives rise to a decrease in perpendicular magnetic anisotropy of the hard magnetic layer 30. From this point, it is preferable to make the nonmagnetic layer thicker and to derive the most suitable thickness thereof based on overall characteristics.

For the spin injection layer 30, CoCr series alloys such as CoCrPt, CoCrTa, CoCrPtTa, CoCrPtB, etc. with a close-packed hexagonal structure may be employed in addition to CoPt series alloys. Artificial lattice films such as Co/Ni, Co/Pd, and Co/Pt which are formed by laminating atomic layers each of Co, Ni, Pd, Pt, etc. alternately may be employed as well. Laminated two or more materials mentioned above may be used.

Figure 2A:
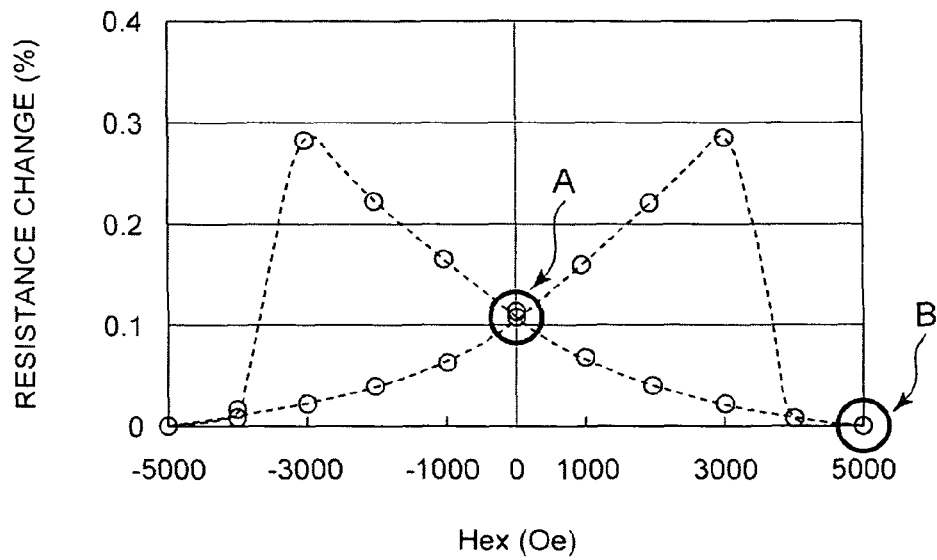
FIGS. 2A and 2B are graphs exemplifying a characteristic of the spin torque oscillator according to the first embodiment of the invention.
Figure 2B:
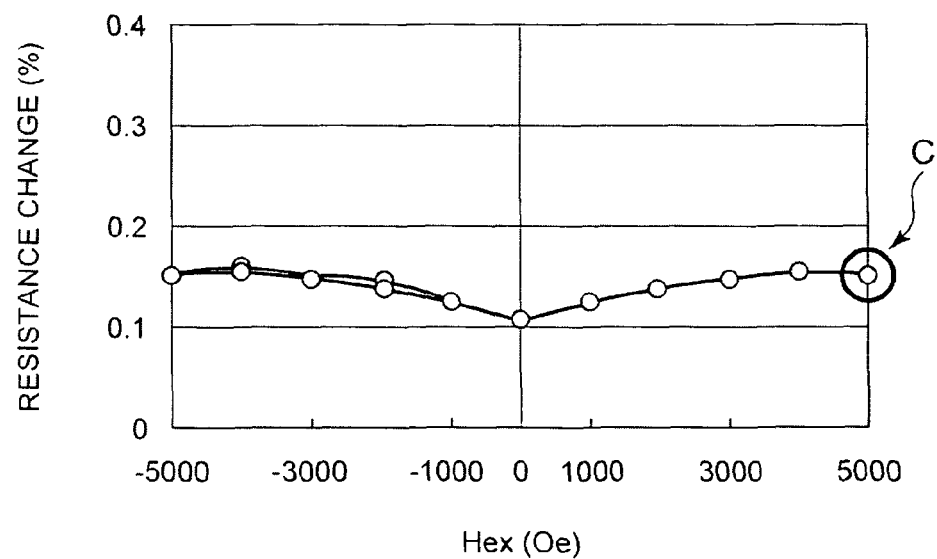
Figure 2C:
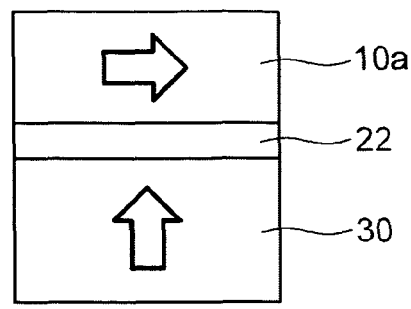
FIGS. 2C and 2D are sectional views schematically showing states of the magnetization in the points A and B in FIG. 2A, respectively.
Figure 2D:
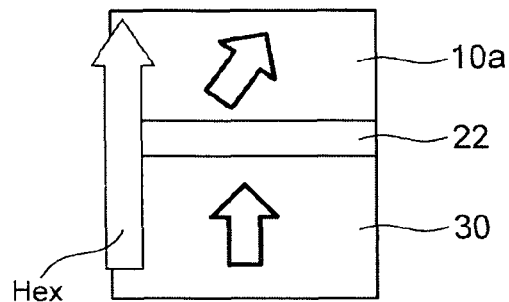
Figure 2E:
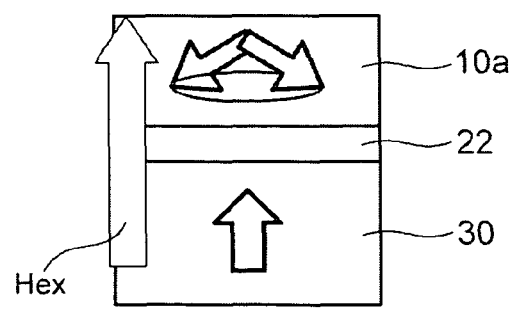
FIG. 2E is a typical sectional view showing the state of the magnetization in the state point C in FIG. 2B.

FIGS. 2A and 2B are graphs illustrating a characteristic of the spin torque oscillator according to the first embodiment of the invention. FIG. 2A shows an RH curve of the spin torque oscillator 10 measured with a low driving current passed therethrough, the current corresponding to a current density J of $0.2 \times 10^8$ A/cm². FIG. 2B shows an RH curve of the spin torque oscillator 10 measured with a high driving current passed therethrough, the current corresponding to a current density J of $1.5 \times 10^8$ A/cm². In FIGS. 2A and 2B, the horizontal and vertical axes represent the external field applied to the spin torque oscillator 10 and a change in resistance (between the first electrode 41 and the second electrode 42) with respect to a current passing through the laminated structure 25, respectively. In FIG. 2B, however, the value of the vertical axis is shifted so that the resistance at Hex=0 coincides with that in FIG. 2A. FIGS. 2C and 2D are sectional views schematically showing states of the magnetization in the points A and B in FIG. 2A, respectively. FIG. 2E is a typical sectional view showing the state of the magnetization in the state of the point C in the FIG. 2B.

As shown in FIG. 2A, the low driving current density results in a typical RH curve which is of a coercive-force difference type, independently of the influence of spin torque. In the state of the point A in FIG. 2A, i.e., under zero external field, the direction of the magnetization in the oscillation layer 10a is parallel to the layer surface in accordance with the shape anisotropy of the oscillation layer 10a, as shown in FIG. 2C. In the state of the point B in FIG. 2A, i.e., under a large external field, the magnetization direction of the oscillation layer 10a is approximately the same as that of the external field, as shown in FIG. 2D.

On the other hand, the large driving current density J results in a valley-shaped RH curve. This means that the oscillation layer 10a is definitely oscillating. In the state of the point C in FIG. 2B, i.e., under the large external field, the magnetization direction of the oscillation layer 10a is opposite to that of the external field, and is precessing as shown in FIG. 2E. That is, spin torque makes the magnetization of the oscillation layer 10a oscillate, the spin torque being caused by the driving current for the spin torque oscillator 10.

Thus, the spin torque oscillator 10 according to this embodiment does not oscillate with a low current density J, e.g., $0.2 \times 10^8$ A/cm$^2$, but oscillates with a proper current density J of $1.5 \times 10^8$ A/cm$^2$.

A perpendicular magnetization film is employed as the spin injection layer 30 of the spin torque oscillator 10 according to the embodiment, thereby being considered to allow it to enhance the efficiency of spin torque transfer.

When a perpendicular magnetization film is employed as the spin injection layer, the trajectory of the magnetization motion in the oscillation layer 10a defines a plane. The plane is substantially perpendicular to the magnetization direction of the spin injection layer 30. That is, the magnetization direction of the oscillation layer 10a is approximately perpendicular to that of the spin injection layer 30 at any time. This allows it to stably transmit the spin torque.

On the other hand, when the spin injection layer 30 is an in-plane magnetization film, the plane defined by a trajectory of the magnetization motion in the oscillation layer 10a is substantially parallel to the magnetization direction of the spin injection layer 30. This causes a change in the angle, which the magnetization direction of the oscillation layer 10a and that of the spin injection layer 30 do, between moments. This results in a high efficiency of spin torque transfer at a certain moment but a low one at another moment, giving rise to a greatly reduced efficiency of spin torque transfer on an average.

Accordingly, the perpendicular magnetization film is employed for the spin injection layer 30 to enhance the efficiency of spin torque transfer, thereby allowing the stable oscillation with a low driving current density.

Therefore, it is preferable that the spin injection layer 30 includes a perpendicular magnetization film.

The spin torque oscillator 10, shown in FIG. 1, was formed via an underlayer on the substrate to be evaluated for the magnetic characteristics thereof. A 5 nm-thick Ta layer, a 5 nm-thick Cu or Ru layer (underlayer), a 5 nm-thick CoFeB soft magnetic layer (the oscillation layer 10a), a 5 nm-thick Cu and a 20 nm-thick CoPt hard magnetic layer (the spin injection layer 30) were laminated in this order to form a laminated film, the laminated film being evaluated for the magnetization curve thereof with a polar Kerr effect evaluation apparatus (made by NEOARK Co. Ltd.).

Since the polar Kerr effect evaluation apparatus evaluates a magneto-optical effect perpendicular to a film surface using light reflected on the film surface, the spin injection layer 30 near the film surface can be preferentially measured. Furthermore, the magnetization curve of the oscillation layer 10a, which is magnetically soft, is almost linear. Correcting the slope of the linear portion of the curve allows it to measure the characteristic mostly of the spin injection layer 30 only. Since the rotation angle $\theta_K$ (Theta K) of the polarization plane of the reflected light is proportional to the perpendicular component of magnetization of each film during the measurement, a change in $\theta_K$ with a magnetic field H applied perpendicularly to the film surface shows the same shape as the magnetization curve fundamentally.

Figure 3A:
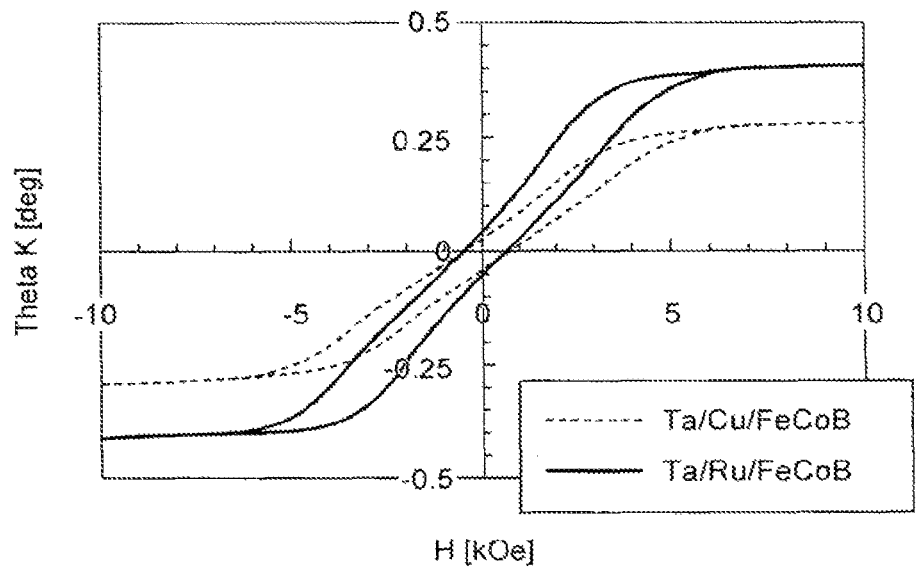
FIGS. 3A and 3B are graphs illustrating measurements of a polar Kerr effect for the same laminated film structure as the spin torque oscillator.

FIG. 3A is a graph illustrating the measurement of the polar Kerr effect for the same laminated film structure as the spin torque oscillator 10. The dotted line and solid line show the cases where the underlayers are Ta/Cu and Ta/Ru, respectively.

Probably because the reflectance of one sample differs from that of the other sample, the saturation value of $\theta_K$ differ from each other, but the coercive force Hc and saturation magnetic field Hs are considered to be the same, showing almost the same characteristics as a magnetization curve. When an FeCoB layer contains 10 at. % or more of B, no reflection from any crystal plane of the layer is identified on the X-ray diffraction measurement, the measurement showing that FeCoB is amorphous in structure. The magnetization curve of the CoPt hard magnetic layer (the spin injection layer 30) does not depend on the underlayer (Cu or Ru), also supporting that FeCoB is amorphous in structure.

The saturation magnetization Ms of this CoPt hard magnetic layer is 1100 emu/cc, and the perpendicular demagnetizing field 4πMs is, therefore, 13.8 kOe, i.e., 4πMs≈13.8 kOe. The slope Hs-Hc of the magnetization curve must be almost the same as 4πMs without the perpendicular anisotropy. In fact, the slope of the magnetization curve is 5 kOe in FIG. 3A, proving the existence of the perpendicular anisotropy.

The anisotropy field was measured for this CoPt hard magnetic layer to obtain a large Hk value of about 12 kOe. The CoPt hard magnetic layer is processed into a square with 70 nm on a side to reduce the demagnetizing field thereof, thereby becoming a perpendicular magnetization film sufficiently.

FIRST COMPARATIVE EXAMPLE

Figure 3B:
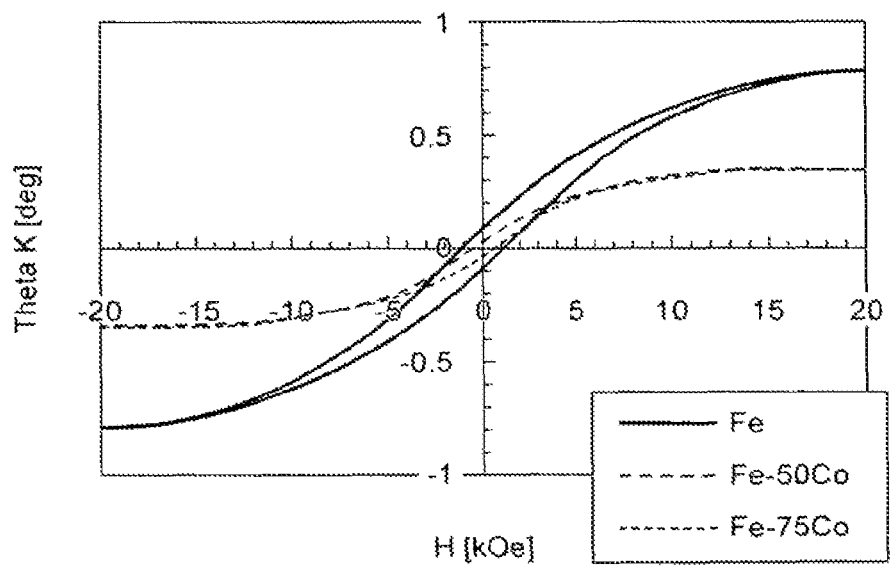

FIG. 3B is a graph illustrating a measurement of the polar Kerr effect for the same laminated film structure as the spin torque oscillator of the first comparative example.

The spin torque oscillator of the first comparative example employs a Fe layer or a FeCo soft magnetic layer as the oscillation layer 10a. The spin torque oscillator of the first comparative example is the same as that of the present embodiment, the explanation being omitted except the oscillation layer. The solid line, the dashed line and the dotted line show the oscillation layers 10a of pure Fe, Fe-50 at. % Co and Fe-75 at. % Co, respectively, the dashed line and the dotted line mostly overlapping.

The horizontal axis in FIG. 3B represents the perpendicularly applied field up to 20 kOe, unlike that in FIG. 3A. Even such a high magnetic field cannot be considered to saturate the magnetization in the perpendicular direction, thus suggesting that the perpendicular anisotropy of the modified example is definitely lower than that of the present embodiment. Additionally, the uniaxial magnetic anisotropy constant was measured with a torque magnetometer to result in an anisotropy field of Hk≈3 kOe.

The magnitude of the perpendicular anisotropy of the CoPt hard magnetic layer (the spin injection layer 30) depends on the crystallinity such as a degree of stacking fault, the crystalline orientation and dispersion of c-axis in the hcp (hexagonal close packed) structure thereof.

The difference between FIGS. 3A and 3B arises from the degree of crystal orientations of the CoPt hard magnetic layers of the present embodiment and the comparative example due to the replacement of the FeCoB soft magnetic layer by the FeCo soft magnetic layer. The CoPt hard magnetic layer of the present embodiment orients its crystal direction well, whereas the crystal orientation of the CoPt hard magnetic layer of the comparative example has become worse owing to the replacement.

The Cu nonmagnetic layer was formed on the amorphous soft magnetic layer in this embodiment to provide an fcc-Cu (111) close-packed plane on the clean and uniform surface of the amorphous layer. This clean and uniform surface is considered to well orient the hcp-CoPt (00.1) close-packed plane.

On the other hand, the crystal structure of the soft magnetic layer in the first comparative example is body-centered cubic for Fe and Fe-50 at. % Co, whereas the crystal structure is face-centered cubic (fcc) for Fe-75 at. % Co. Both are polycrystalline. Even though the crystal orientation is made mostly full in the perpendicular direction, the in-plane crystal axes vary every crystal grain. Moreover, various crystal planes can be formed in the perpendicular orientation depending on the combination of crystal orientation with its underlayer (e.g. Cu or Ru). When the soft magnetic layer is polycrystalline, the surface thereof is less homogeneous than that of the amorphous soft magnetic layer. This supposedly disrupted the crystal orientation of the crystalline Cu nonmagnetic layer to further worsen the crystal orientation of the CoPt hard magnetic layer on the crystalline Cu layer.

From the above-mentioned mechanism, the nonmagnetic layer 22 with a close-packed structure and the hard magnetic layer 30 are laminated one by one on the amorphous soft magnetic layer 10a to obtain the spin injection layer 30 with high perpendicular magnetic anisotropy. Therefore, the spin torque oscillator 10 according to this embodiment can have a higher efficiency of spin torque transfer than that of the first comparative example, allowing it to cause a stable oscillation with a low current density.

Thus, owing to the spin torque oscillator 10 according to this embodiment, it is possible to cause a stable oscillation with a low current density, thereby providing a spin torque oscillator with a high intensity of the high-frequency in-plane magnetic field.

An FeCoAl layer, an FeCoSi layer or their laminated layer may be employed for the oscillation layer 10a to be disposed between the amorphous soft magnetic layer and the nonmagnetic layer. These alloys are employed in order to adjust the saturation magnetic flux density (Bs), anisotropy field (Hk) and a efficiency of spin torque transfer of the oscillation layer 10a and the spin injection layer 30.

When these soft magnetic layers are crystalline, the soft magnetic layers might possibly worsen the crystal orientation of the spin injection layer 30 because of the mechanism mentioned above. Despite of that, the soft magnetic layers with a thickness of 2 nm or less does not sufficiently crystallize. Thus, the crystal orientation of the spin injection layer 30 does not worsen significantly because of the insertion of these soft magnetic layers therebetween. On the other hand, the soft magnetic layer with a thickness of 0.5 nm or more can enhance the efficiency of spin torque transfer, thus the thickness thereof being preferably 0.5 nm to 2 nm.

Here, a "Fe—Co—(Al, Si) alloy" is an alloy containing Fe, Co, and at least one of Al and Si.

The thickness of the oscillation layer 10a is preferably 5 to 20 nm, and the thickness of the spin injection layer 30 is preferably 5 to 60 nm. The spin torque oscillator 10 preferably has a square with 70 nm to 100 nm on a side, and may be not only a rectangular parallelepiped but also a cylinder or a hexagonal cylinder.

Second Embodiment

Figure 4:
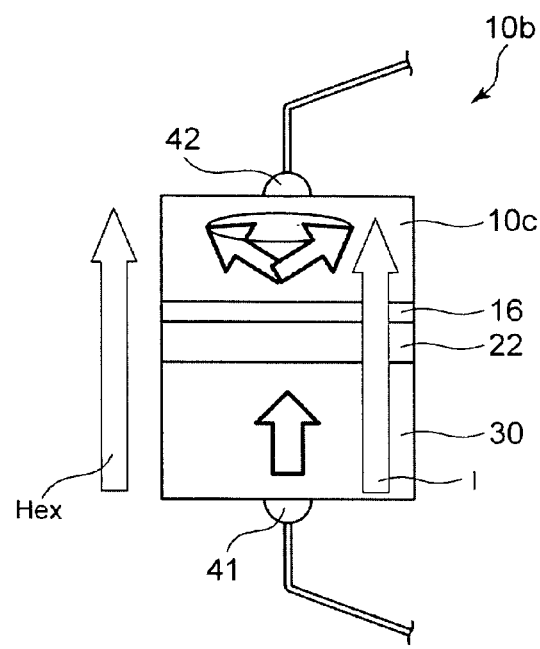
FIG. 4 is a sectional view schematically illustrating a configuration of a spin torque oscillator according to a second embodiment of the invention.

FIG. 4 is a sectional view schematically illustrating a configuration of a spin torque oscillator 10b according to a second embodiment of the present invention. As shown in FIG. 4, in a spin torque oscillator 10b according to this embodiment, a oscillation layer 10c includes a Fe—Co—(Al, Si) alloy. The spin torque oscillator 10b according to the second embodiment is provided with the soft magnetic layer 10c including Fe—Co—(Al, Si), an amorphous layer 16 formed on the soft magnetic layer, a nonmagnetic layer 22 with a close-packed crystal structure formed on the amorphous layer, and a hard magnetic layer 30 with a close-packed crystal structure and perpendicular magnetic anisotropy formed on the nonmagnetic layer. Alternatively, in the spin torque oscillator 10b according to this embodiment, the oscillation layer 10c (crystalline soft magnetic layer 10c) may include just one magnetic layer, and the one magnetic layer may include a Fe—Co—(Al, Si) alloy. The oscillation layer 10c (crystalline soft magnetic layer 10c) may further include two or more magnetic layers, and at least one of the two or more magnetic layers may include a Fe—Co—(Al, Si) alloy.

The spin torque oscillator 10b of the second embodiment is the same as that of the first embodiment, except the oscillation layer 10c. That is, a 3-nm thick Cu is employed for the nonmagnetic layer 22. In addition, the spin torque oscillator 10 has a square with 70 nm on a side.

An FeCoB alloy or a CuB alloy was employed for the amorphous layer 16. Both alloys become amorphous by adding 10 at. % B or more. When the nonmagnetic layer with a close-packed crystal structure and the hard magnetic layer are laminated one by one on the amorphous layer, the spin injection layer 30 with high perpendicular magnetic anisotropy can be obtained based on the mechanism same as that in the first embodiment. Therefore, the spin torque oscillator 10b according to this embodiment can acquire a higher efficiency of spin torque transfer than the spin torque oscillator 10 of the first comparative example, thereby allowing it to cause a stable oscillation with a low current density.

The spin torque oscillator 10b having such a configuration according to the second embodiment becomes a good oscillator with a current density J of $1.4 \times 10^8$ A/cm$^2$ under the application of an external magnetic field of 6 kOe. That is, the magnetization in the oscillation layer 10a of the spin torque oscillator 10b shows a large precessional motion, a deflection angle of the precessional motion reaching 90°. The deflection angle is defined as an angle between the external magnetic field and the magnetization during the precessional motion.

Figure 5A:
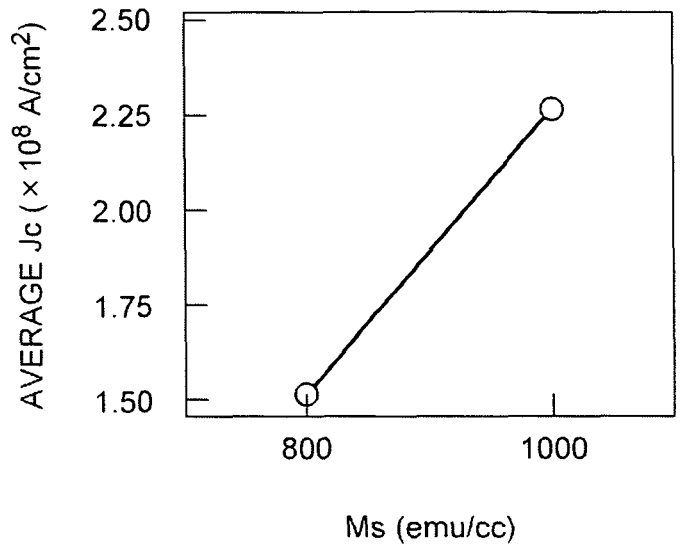
FIGS. 5A and 5B are graphs illustrating characteristics of the spin torque oscillator according to the second embodiment of the invention.
Figure 5B:
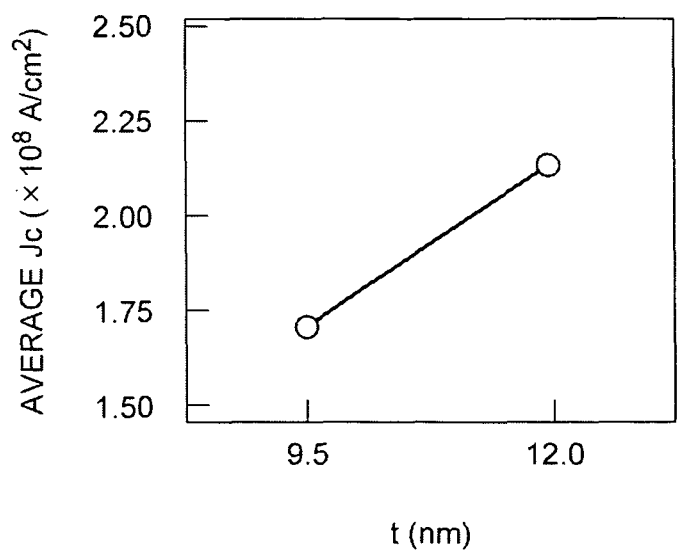

FIGS. 5A and 5B are graphs illustrating the characteristics of the spin torque oscillator 10b according to the second embodiment of the invention. That is, FIGS. 5A and 5B are graphs illustrating the experimental results on the relationship between the critical current density Jc and the saturation magnetization Ms of the oscillation layer 10c, and the relationship between the critical current density Jc and the film thickness t of the oscillation layer 10c, respectively. The critical current density Jc is defined as a current density when the deflection angle of the magnetization Ms reaches 90° in the oscillation layer 10c. The horizontal axes of the FIGS. 5A and 5B represent the saturation magnetization Ms and layer thickness t of the oscillation layer 10c, respectively. The vertical axes of the FIGS. 5A and 5B represent the absolute value of the average value Jc of the critical current density when the deflection angle of the precessional motion of the magnetization becomes 90° everywhere in the layer thickness direction of the oscillation layer 10c.

As shown in FIGS. 5A and 5B, the dependence of the critical current density Jc on the saturation magnetization Ms is larger than the dependence thereof on the layer thickness t. That is, the slope of the critical current density Jc with respect to the saturation magnetization Ms is twice as much as that with respect to the layer thickness t. That is, the critical current density Jc is proportional to the layer thickness t of the oscillation layer 10c, and proportional to the square of the saturation magnetization Ms. That is, the critical current density Jc is proportional to $tMs^2$.

In the spin torque oscillator 10b, a high frequency magnetic field Hac is generated by magnetic charges appeared on the surface facing the oscillation layer 10c. Consequently, when the magnetization of the oscillation layer 10a precesses uniformly at a large deflection angle (=180°), the intensity Hac of the high frequency magnetic field is supposedly proportional to the product (tMs) of the layer thickness t and the saturation magnetization Ms of the oscillation layer 10c.

As a result, when the saturation magnetization Ms of the oscillation layer 10c is small, a high intensity Hac of the high frequency magnetic field necessary for the high frequency magnetic field assist recording cannot be obtained without thickening the layer thickness t.

Concerning the oscillation layer 10c, it is, therefore, necessary for the enhancement of the intensity Hac of the high frequency magnetic field to employ a magnetic material with low saturation magnetization in order to reduce the critical current density Jc thereof, and to make the layer thickness thereof as thick as possible within a range of practical use.

Figure 6:
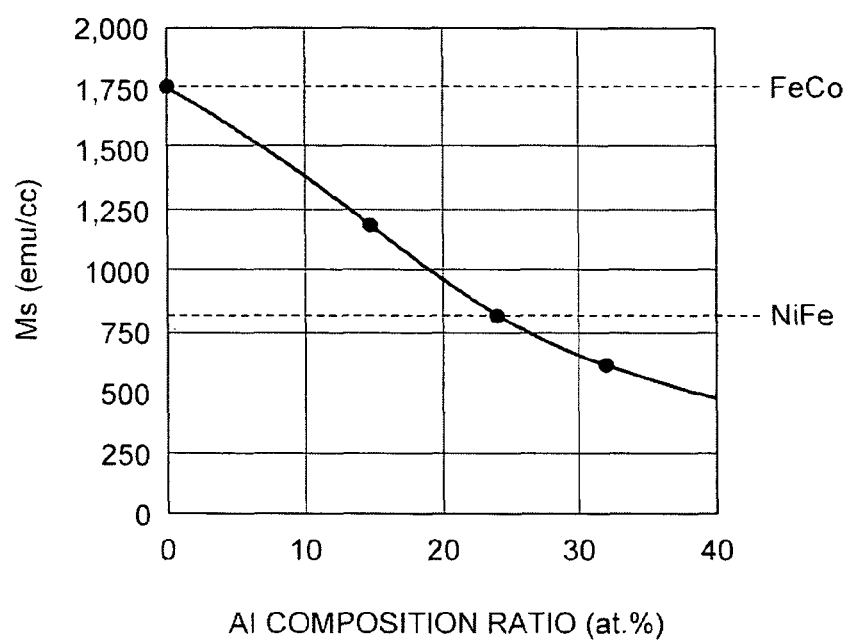
FIG. 6 is a graph illustrating a characteristic of a FeCoAl alloy to be used for the spin torque oscillator according to the first embodiment of the invention.

FIG. 6 is a graph illustrating a characteristic of the FeCoAl alloy to be used for the spin torque oscillator 10 according to the first embodiment of the invention. That is, FIG. 6 illustrates a relationship between the Al composition ratio in the FeCoAl alloy versus the saturation magnetization Ms thereof. The horizontal and vertical axes represent the Al composition ratio of the FeCoAl alloy and the saturation magnetization Ms thereof, respectively.

The values of the saturation magnetization of FeCo and NiFe are shown by the dashed lines for comparison in FIG. 6.

As shown in FIG. 6, the increase in Al composition ratio of the FeCoAl alloy causes the decrease in the saturation magnetization Ms thereof. In the range of the Al composition ratio of 24 at. % or more, the saturation magnetization Ms of the FeCoAl alloy becomes equal to or less than that of the NiFe alloy.

Spin torque is transferred at the interface between the nonmagnetic layer 22 and the oscillation layer 10c. When the oscillation layer 10c is too thick, the precession motion with a low deflection angle often occurs in a region far from the interface although the precession motion with a largest deflection angle of 90° takes place near the interface. For this reason, even making thicker the oscillation layer 10c cannot necessarily enhance the intensity Hac of the high frequency magnetic field. Therefore, the thickness t of the oscillation layer 10c is required to be 30 nm or less in order to obtain a large precession motion (the deflection angle: 90°) homogeneously everywhere in the thickness direction of the oscillation layer 10c.

When a material with low saturation magnetization Ms is employed for the oscillation layer 10c, the saturation magnetization Ms of the material is required to be 500 emu/cc or more in order to obtain the intensity Hac of the high frequency magnetic field necessary for the large precession motion. The experimental result on the Al composition ratio dependence of the saturation magnetization Ms suggests that the Al composition ratio is preferably 40 at. % or less.

On the other hand, it is optimal to set the saturation magnetization Ms of the oscillation layer 10c to 700 emu/cc through 1000 emu/cc. Then, the layer thickness t of the oscillation layer 10c is set to 10 nm through 25 nm to allow the magnetization of the oscillation layer 10c to precess with a large deflection angle of 90° everywhere in the layer thickness direction thereof. That is, the intensity Hac of the high frequency magnetic field can be most efficiently enlarged at this time. For this reason, the Al composition ratio is more preferably 20 at. % to 30 at. %.

On the other hand, as mentioned in FIG. 5, when the saturation magnetization Ms of the oscillation layer 10c increases, the critical current density Jc (driving current I) also increases in proportion to the square of Ms. Joule heating of the spin torque oscillator 10b increases in proportion to the square of the driving current I. This means that the Joule heating thereof increases in proportion to the fourth power of the saturation magnetization Ms. When the saturation magnetization Ms of the spin torque oscillator 10b is larger than 1300 emu/cc, the spin torque oscillator 10b is difficult to use because of deterioration of the characteristic thereof due to the Joule heating.

Therefore, the saturation magnetization Ms of the oscillation layer 10c is preferably 1300 emu/cc or less. Consequently, it is deduced from the experiment of the dependence of the saturation magnetization Ms on the Al composition ratio, as illustrated in FIG. 6, that the Al composition ratio is preferably 12 at. % or more.

The principle of the spin torque effect in a spin torque oscillator is considered to be the same as that of the CPP-GMR (Current Perpendicular to Plane—Giant Magneto-Resistive) effect. Both principles arise from the identical origin. Consider a phenomenon in the laminated structure 25 including first and second magnetic layers with their magnetization directions antiparallel to each other and a nonmagnetic layer disposed between the two magnetic layers. The phenomenon is that electrons which are spin-polarized in the magnetization direction of the first magnetic layer flow into the second magnetic layer via the nonmagnetic layer. The electrons being spin-polarized in the magnetization direction of the first magnetic layer are scattered at the moment of flowing into the second magnetic layer, thereby transferring the spin angular momenta as spin torque concurrently with a resistance increase. This means that an increase in MR ratio links directly with an increase in the efficiency of spin torque transfer.

Consequently, it is preferable to employ materials with a large GMR effect for the oscillation layer and the interfacial surfaces of the spin injection layer. Therefore, the composition of FeCo in the FeCo—(Al, Si) alloy is preferably 20 at. % or more, which makes the crystal structure of the alloy body-centered cubic, to be employed for the oscillation layer 10c of the spin torque oscillator 10b according to this embodiment.

As mentioned above, the Al composition ratio is set to 10 at. % through 40 at. % in the FeCoAl alloy to be employed for the oscillation layer 10c in the spin torque oscillator 10b according to this embodiment to allow it to obtain the sufficient intensity of the high frequency magnetic field, thereby manufacturing a spin torque oscillator available with a low driving current.

USPA20050110004 discloses that the FeCoAl alloy is used for the free layer. However, the technical subject disclosed in USPA20050110004 relates to a TMR applied to a longitudinal magnetic memory, differing from that of the present invention aiming at the application of GMR to the spin torque oscillator. In USPA20070063237, the use of the Heusler alloy is assumed to confine the FeCoAl alloy to the fixed composition $Co_2FeAl$, thus differing from the FeCoAl alloy of the spin torque oscillator 10b according to this embodiment in the composition of FeCo. The reduction in Jc by employing FeCoAl is described regarding the longitudinal CPP-GMR head application (J. Appl. Phys. 101 093905 (2007)). This effect can be explained using $Jc \propto tMs^2$. On the other hand, the spin torque oscillator according to the present embodiment employs the perpendicular magnetization film, and is capable of operating with a low Jc on the basis of a newly discovered effect which cannot be explained by Jc∝tMs².

Using the FeCoAl alloy for the oscillation layer 10c allows it to enhance the spin torque transfer efficiency more than using CoFe/NiFe for the oscillation layer. However, it is not preferable to directly form the crystalline nonmagnetic layer on the crystalline oscillation layer 10c as mentioned above, because it deteriorates the crystal orientation of the spin injection layer 30 to lower the perpendicular magnetic anisotropy thereof.

Consequently, forming the FeCoB alloy or a Cu—B alloy (referred to as a "CuB" alloy) as the amorphous layer 16 between the crystalline oscillation layer 10c and the crystalline nonmagnetic layer 22 allows it to enhance the perpendicular magnetic anisotropy of the spin injection layer 30. This leads to the enhancement of the spin torque transfer efficiency.

Since FeCoB is a soft magnetic material, FeCoB layer insertion can be used to adjust the saturation magnetic flux densities (Bs), an anisotropy field (Hk), and the spin torque transfer efficiency of the oscillation layer 10c and the spin injection layer 30. On the other hand, since CuB is a nonmagnetic material, CuB layer insertion can improve the crystal orientation of the spin injection layer 30 without affecting the spin torque transfer efficiency etc. so much.

Thereby, according to the spin torque oscillator 10b of this embodiment, a spin torque oscillator capable of causing a stable oscillation with a low current density and a high intensity of the high frequency magnetic field can be provided.

Alternatively, the spin torque oscillator 10b may employ various kinds of materials and layer thicknesses other than the materials and layer thicknesses mentioned above.

For example, materials with long spin diffusion length and a face-centered cubic structure, such as Cu, Au, and Ag, can be used for the nonmagnetic layer 22. It is preferable to set the layer thickness of the nonmagnetic layer 22 to one atomic layer through 3 nm for a magnetic interaction between the oscillation layer 10c and the spin injection layer 30. However, making thinner the nonmagnetic layer 22 deteriorates the crystallinity of the nonmagnetic layer 22 and the hard magnetic layer 30 thereon to lower the perpendicular magnetic anisotropy of the hard magnetic layer 30. Accordingly, although the nonmagnetic layer 22 is preferably made thicker, it is preferable to define the most suitable layer thickness thereof from comprehensive characteristics.

CoCr series alloys such as CoCrPt, CoCrTa, CoCrPtTa, CoCrPtB, etc. having a hexagonal close-packed structure, and artificial lattices such as Co/Ni, Co/Pd, Co/Pt, etc. with close-packed hexagonal Co, Ni, Pd, Pt, etc. laminated alternately in an atomic layer order can be employed suitably for the spin injection layer 30 in addition to the CoPt series alloys. Alternatively, two or more above-mentioned materials laminated may be employed.

An FeCoAl alloy containing one or more of Si, Ge and Mn as additives may be employed for the oscillation layer 10c. Furthermore, FeCoSi, FeCoGe and FeCoMn alloys which are made by substituting one or more of Si, Ge, and Mn for Al of the FeCoAl alloy, respectively, may be employed for the oscillation layer 10c. These alloys can adjust the saturation magnetic flux density (Bs), the anisotropy field (Hk) and the spin torque transfer efficiency between the oscillation layer 10c and the spin injection layer 30.

That is, the spin torque oscillator 10b according to this embodiment includes the Fe—Co—(Al, Si, Ge, Mn) alloy for the oscillation layer 10c and the FeCoB alloy or CuB alloy as the amorphous layer 16 between the nonmagnetic layer 22 and the oscillation layer 10c.

In addition, it is preferable that the layer thickness of the oscillation layer 10c is 5 to 20 nm, and the thickness of the spin injection layer 30 is 2 to 60 nm. Si is characteristically hard to diffuse from the FeCo alloy matrix. For this reason, it is effective to use the FeCoSi alloy when the diffusion control is needed in some device manufacturing processes.

Third Embodiment

Figure 7:
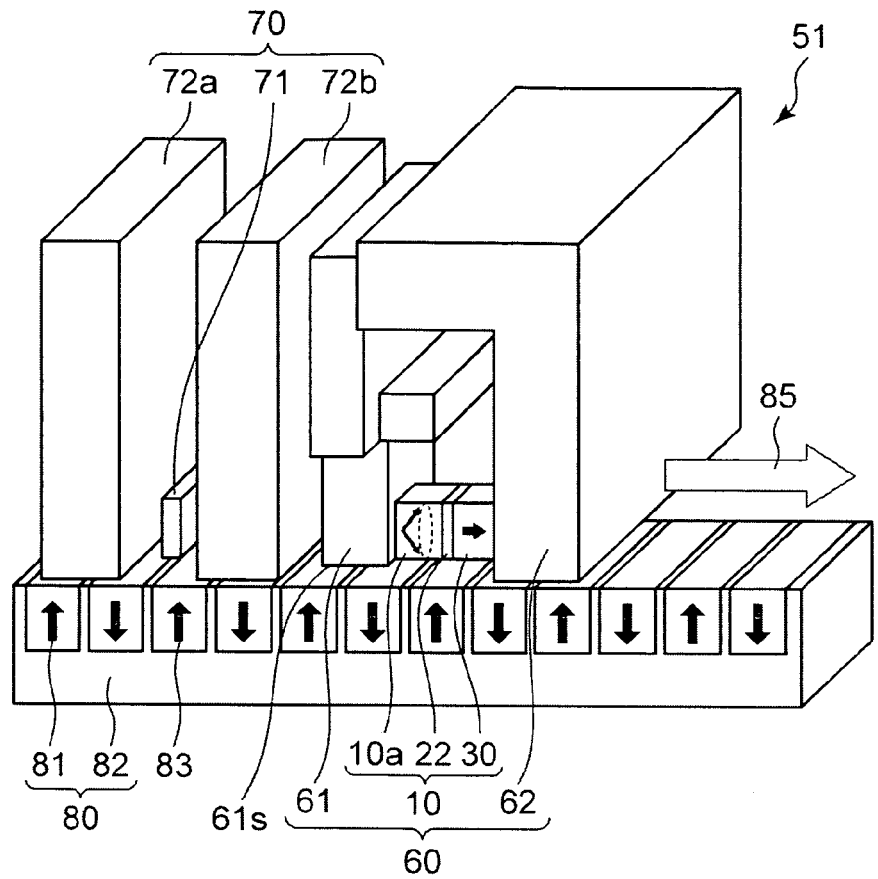
FIG. 7 is a typical perspective view illustrating a configuration of a magnetic recording head according to a third embodiment of the invention.
Figure 8:
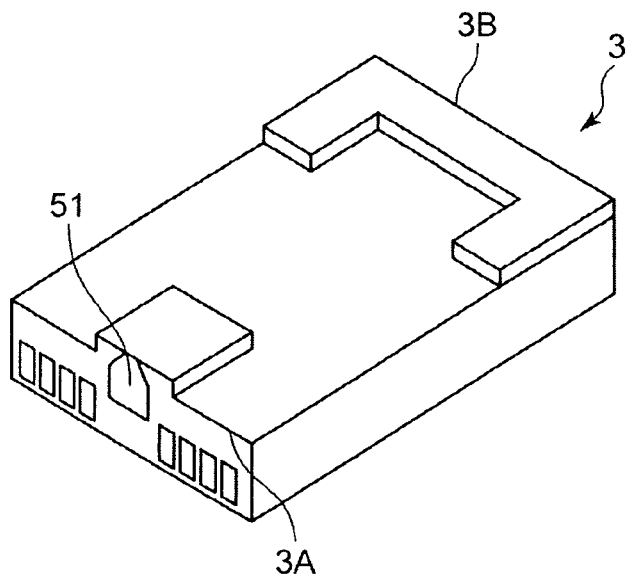
FIG. 8 is a typical perspective view illustrating a configuration of a head slider to carry a magnetic recording head according to the third embodiment of the invention.
Figure 9:
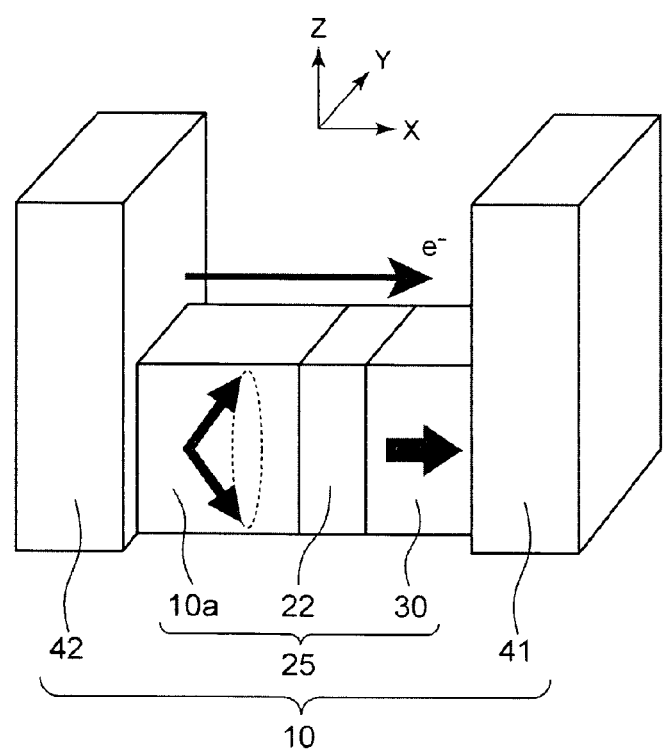
FIG. 9 is a typical perspective view illustrating a configuration of a spin torque oscillator used for the magnetic recording head according to the third embodiment of the invention.

The magnetic recording head according to a third embodiment of the invention is explained assuming that recording is performed on the perpendicular magnetic recording medium including patterned magnetic particles thereon. FIG. 7 is a typical perspective view illustrating a configuration of a magnetic recording head according to the third embodiment of the invention. FIG. 8 is a typical perspective view illustrating a configuration of a head slider to carry a magnetic recording head according to the third embodiment of the invention. FIG. 9 is a typical perspective view illustrating a configuration of a spin torque oscillator to be used for the magnetic recording head according to the third embodiment of the invention.

As shown in FIG. 7, the magnetic recording head 51 according to the third embodiment of the invention is provided with a magnetic pole 61 and the spin torque oscillator 10 according to the above-mentioned embodiment of the invention.

Alternatively, although the spin torque oscillator 10 according to the first embodiment is used as a spin torque oscillator in this example, the present invention can employ not only the spin torque oscillator 10b according to the second embodiment, but also various kinds of spin torque oscillators modified therefrom. An example using the spin torque oscillator 10 according to the first embodiment as a spin torque oscillator is explained below.

As shown in FIG. 7, the oscillation layer 10a can be arranged between the magnetic pole 61 and the spin injection layer 30.

A writing head portion 60 includes the magnetic pole 61 mentioned above and the spin torque oscillator 10. The writing head portion 60 can further include a return path (shield) 62.

In addition, the magnetic pole 61 and the first electrode 42 are shared, and the return path (shield) 62 and the second electrode 41 are also shared.

As shown in FIG. 7, a reproducing head portion 70 can be further provided to the magnetic recording head 51 according to this embodiment. The reproducing head portion 70 includes a first magnetic shield layer 72a, a second magnetic shield layer 72b and a magnetic reproducing element 71 provided between the first magnetic shield layer 72a and the second magnetic shield layer 72b. The respective elements of the reproducing head portion 70 mentioned above and the respective elements of the writing head portion 60 mentioned above are separated by insulators such as alumina not shown in the figure.

As the magnetic reproducing element 71, a GMR element, a TMR (Tunnel Magneto-Resistive effect) element, etc. can be employed. In order to enhance the reproducing resolution, the magnetic reproducing element 71 is mounted between the two sheets, i.e., the first and second magnetic shield layers 72a, 72b.

Then, as shown in FIG. 7, a magnetic recording medium 80 is placed so that the magnetic recording medium 80 faces the medium-facing surface 61s of the magnetic recording head 51. The magnetic pole 61 applies a recording magnetic field to the magnetic recording medium 80. The medium-facing surface 61s of the magnetic recording head 51 can be a principal plane of the magnetic pole 61 facing the magnetic recording medium 80 to be placed for the magnetic recording head.

Alternatively, as shown in FIG. 8, e.g., the magnetic recording head 51 is mounted on the head slider 3. The head slider 3 includes $Al_2O_3$/TiC, etc., and is designed to be capable of moving relatively to the recording medium 80, e.g., a magnetic disk with flying thereon or contacting thereto. The head slider 3 has an air inflow side 3A and an air outflow side 3B. The magnetic recording head 51 is arranged on the side surface of the air outflow, etc. Thereby, the magnetic recording head 51 mounted on the head slider 3 moves relatively to the magnetic recording medium 80 with flying thereon or contacting thereto.

As shown in FIG. 7, the magnetic recording medium 80 has a medium substrate 82 and a magnetic recording layer 81 provided on the substrate 82. The magnetization 83 of the magnetic recording layer 81 is controlled in a predetermined direction by the magnetic field applied from the writing head portion 60 to thus perform writing. In addition, the magnetic recording medium 80 moves in the medium-moving direction 85 relatively to the magnetic recording head 51 at this time. On the other hand, the reproducing head portion 70 reads the magnetization directions of the magnetic recording layer 81.

As shown in FIG. 9, the spin torque oscillator 10 used for this embodiment is provided with a laminated structure 25, the laminated structure 25 including the oscillation layer 10a, the nonmagnetic layer 22 having long spin diffusion length and the spin injection layer 30, which are laminated in this order. The spin torque oscillator 10 generates a high frequency magnetic field by passing a driving electron flow through the first electrode 41 and the second electrode 42 which were connected to the laminated structure 25. The driving current density is suitably adjusted to obtain a predetermined oscillation state. In addition, when a recording track pitch is reduced and the size of the spin torque oscillator becomes small, heat release is promoted to allow it to reduce the driving current density.

Each component of the spin torque oscillator 10 has been already explained in the first embodiment, and the explanation thereon is omitted here.

The magnetic pole 61 and the return path 62 include soft magnetic layers with comparatively large saturation magnetic flux density, such as FeCo, CoFe, CoNiFe, NiFe, CoZrNb, FeN, FeSi, FeAlSi, etc.

Alternatively, the material on the side of the medium-facing surface 61s of the magnetic pole 61 is different from that of any portions other than the side of the medium-facing surface 61s of the magnetic pole 61. That is, in order to increase a magnetic field applied to the magnetic recording medium 80 or a magnetic field generated by the spin torque oscillator 10, FeCo, CoNiFe, FeN, etc. with a particularly large saturation magnetic flux density are employed for the materials of the portion on the side of the medium-facing surface 61s of the magnetic pole 61. Any portions other than the side of the medium-facing surface 61s of the magnetic pole 61 may include FeNi, etc. with a particularly high permeability. Alternatively, the size of the portion on the side of the medium-facing surface 61s of the magnetic pole 61 may be smaller in order to enlarge the magnetic field applied to the magnetic recording medium 80 or the spin torque oscillator 10. Thereby, magnetic flux concentrates on the side of the medium-facing surface 61s. This allows it to generate a high magnetic field.

Materials, which are hard to be oxidized and have low resistances, such as Ti, Cu, etc. may be employed for the magnetic pole 61.

The magnetic recording head 51 with such a configuration can provide a magnetic head for high density recording due to the spin torque oscillator with a high intensity of the in-plane high frequency magnetic field, which is capable of causing a stable oscillation with a low current density and feeding a stable high frequency magnetic field.

A maximum region of the intensity Hac of the high frequency magnetic field from the spin torque oscillator 10 is on the reading and trailing sides of the oscillation layer 10a. The positions of the spin torque oscillator 10, the magnetic pole 61 and a shield 62 are adjusted so as to overlap a maximum region of the recording magnetic field from the magnetic pole 61 and the maximum region of the intensity Hac on the trailing side, thereby allowing it to record well.

The spin torque oscillator 10b explained in the second embodiment can be employed as a spin torque oscillator in the magnetic recording head 51 according to this embodiment. That is, the magnetic recording head 51 is provided with the crystalline oscillation layer 10c, the amorphous layer 16, the nonmagnetic layer 22 with a close-packed crystal structure, and the spin injection layer 30 with a close-packed crystal structure and perpendicular magnetic anisotropy. Thereby, the spin torque transfer efficiency is further enhanced.

Therefore, a magnetic recording head capable of performing a high density recording is provided on the basis of the spin torque oscillator capable of more stably causing an oscillation with a low current density and more stably feeding a high-frequency magnetic field.

Also in this case, a maximum region of the intensity Hac of the high frequency magnetic field from the spin torque oscillator 10 is on the reading and trailing sides of the oscillation layer 10a. The positions of the spin torque oscillator 10, the magnetic pole 61 and the shield 62 are adjusted so as to overlap the maximum of the recording magnetic field from the magnetic pole 61 and the maximum region on the trailing side of the intensity Hac of the high frequency magnetic field, thereby allowing it to record well.

A Cu layer may be disposed between the magnetic pole 61 and the oscillation layer 10a. This allows it to prevent Al atoms in the oscillation layer 10a of the FeCoAl alloy from diffusing. As a result, it becomes possible to manufacture an excellent spin torque oscillator.

Therefore, a magnetic recording head capable of performing a high density recording is provided on the basis of the spin torque oscillator capable of more stably causing an oscillation with a low current density and more stably feeding a high-frequency magnetic field.

Fourth Embodiment

A magnetic recording apparatus and a magnetic head assembly according to a fourth embodiment of the invention are explained below. The above-explained magnetic recording heads according to the embodiments of the present invention are built into the magnetic head assembly of all-in-one write-in/read-out type, and can be mounted into a magnetic recording apparatus. The magnetic recording apparatus according to this embodiment can also have only a recording function, and can also have both recording and reproducing functions.

Figure 10:
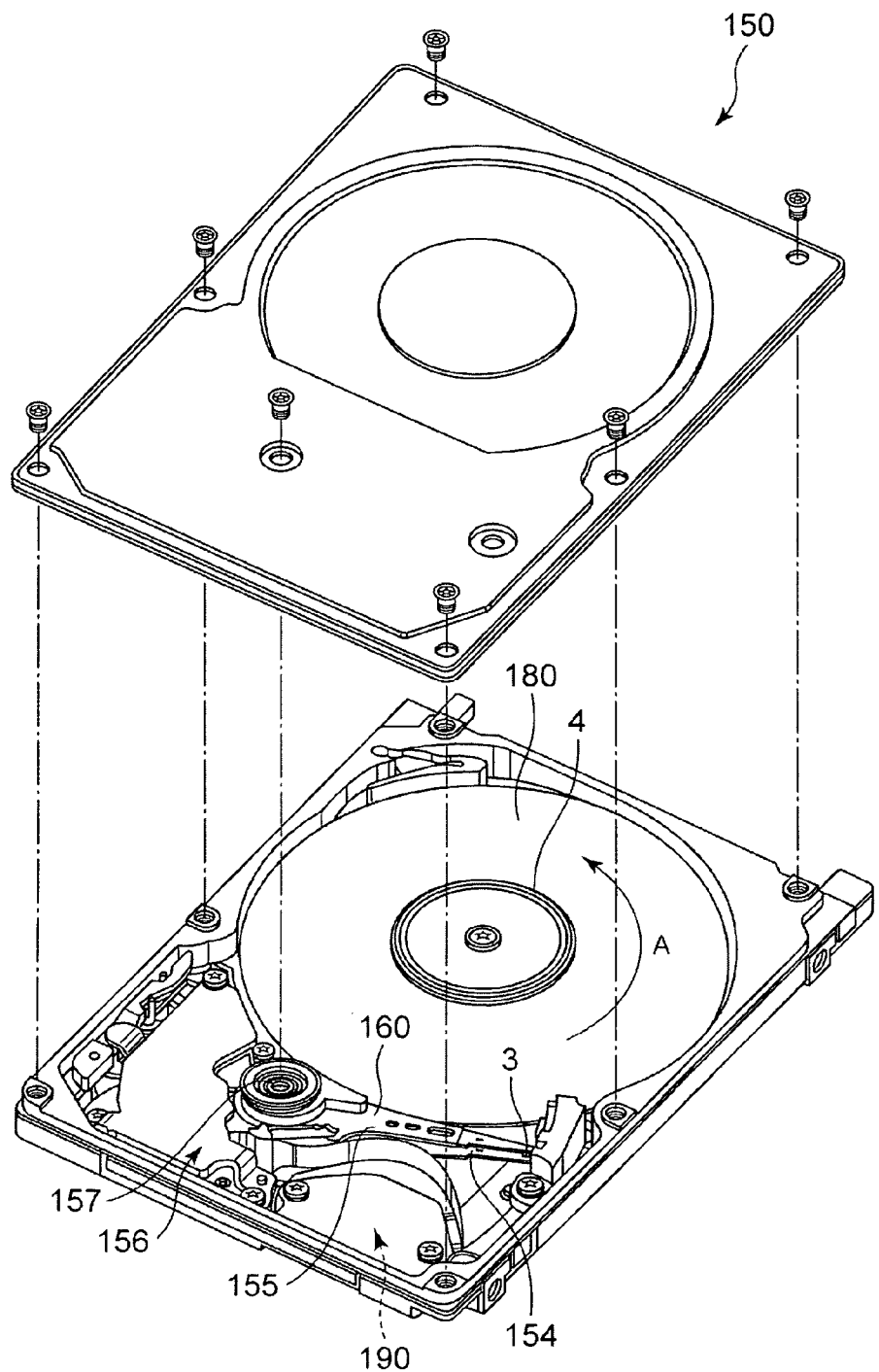
FIG. 10 is a typical perspective view illustrating a configuration of a magnetic recording apparatus according to a fourth embodiment of the invention.
Figure 11A:
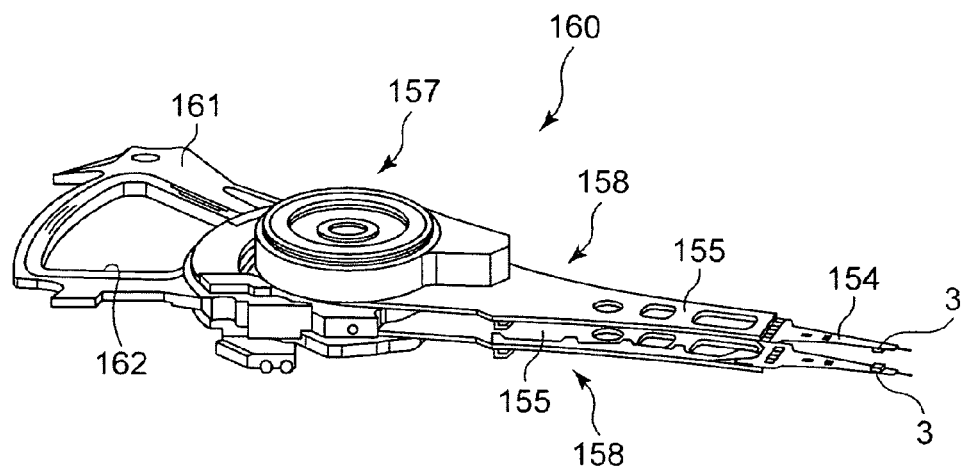
FIGS. 11A and 11B are typical perspective views illustrating a configuration of a portion of the magnetic recording apparatus according to the fourth embodiment of the invention.
Figure 11B:
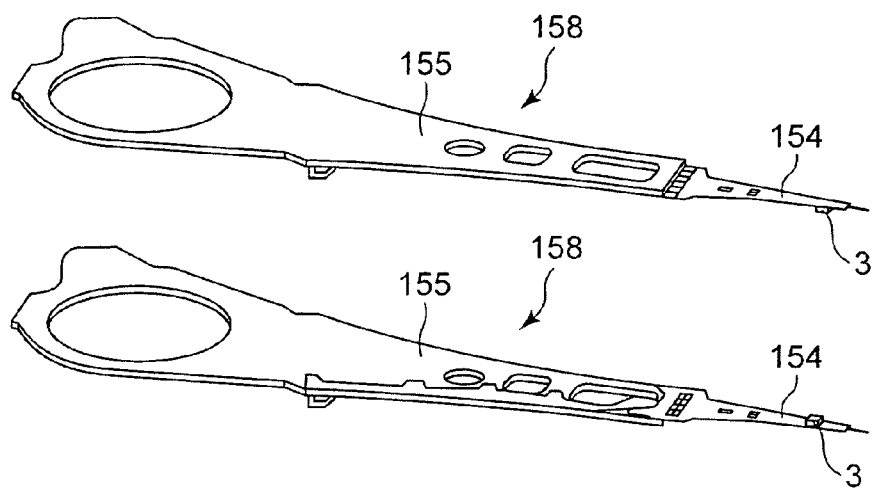

FIG. 10 is a typical perspective view illustrating a configuration of the magnetic recording apparatus according to the fourth embodiment of the invention. FIGS. 11A and 11B are typical perspective views illustrating a configuration of a portion of the magnetic recording apparatus according to the fourth embodiment of the invention. As shown in FIG. 10, a magnetic recording apparatus 150 according to the fourth embodiment of the invention is a type of apparatus using a rotary actuator. As shown in FIG. 10, a recording medium disk 180 is mounted onto a spindle motor 4, and is rotated in the direction of the arrow A by the motor not shown in the figure in response to control signals from a control portion of the driving unit not shown in the figure. Alternatively, the magnetic recording apparatus 150 according to this embodiment may be provided with two or more recording medium disks 180.

A head slider 3 which performs recording/reproducing information to be stored in the medium disk 180 has the configuration mentioned above, and is attached at the tip of a filmy suspension 154. Here, the head slider 3 carries the magnetic recording head according to the embodiment mentioned above, for example, near the tip thereof.

The rotation of the recording medium disk 180 results in a balance between a pressure generated by the suspension 154 and a pressure arising at the medium-facing surface (ABS) of the head slider 3, thereby holding the medium-facing surface of the magnetic recording head apart from the surface of the recording medium disk 180 with a prescribed flying height. The magnetic recording apparatus 150 may be of so called a "contact run type" where the head slider 3 runs in contact with the recording medium disk 180.

The suspension 154 is connected to an end of an actuator arm 155 with a bobbin portion to hold a drive coil not shown in the figure. The other end of the actuator arm 155 is provided with a voice coil motor 156, i.e., a kind of a linear motor. The voice coil motor 156 can be configured with a drive coil (not shown) and a magnetic circuit, the drive coil being wound up onto the bobbin portion of the actuator arm 155, the magnetic circuit including a permanent magnet arranged as facing so as to sandwich the coil and a facing yoke.

The actuator arm 155 is held by ball bearings which are provided on upper and lower two sides of a bearing portion 157, and can rotate slidably by the voice coil motor 156. As a result, it is possible to move the magnetic recording head to an arbitrary position of the recording medium disk 180.

FIG. 11A illustrates a configuration of a portion of the magnetic recording apparatus according to this embodiment, and enlarges a head stack assembly 160 as a perspective view. FIG. 11B is a perspective view illustrating a magnetic head stack assembly (head gimbal assembly) 158 which becomes a portion of the head stack assembly 160. As shown in FIG. 11A, the head stack assembly 160 is provided with the bearing portion 157, the head gimbal assembly (HGA) 158 and a support frame 161, the head gimbal assembly 158 extending from the bearing portion 157, the support frame 161 supporting a coil 162 of the vice coil motor while extending from the bearing portion 157 in a direction opposite to the HGA.

As shown in FIG. 11B, the head gimbal assembly 158 has an actuator arm 155 extending from the bearing portion 157 and a suspension 154 extending from the actuator arm 155.

The head slider 3 having the magnetic recording head according to the embodiments of the invention is attached to the tip of the suspension 154. As already explained, the magnetic recording head according to the embodiments of the invention is attached to the head slider 3.

That is, the magnetic head assembly (head gimbal assembly) 158 according to the embodiment of the invention is provided with the magnetic recording head according to the embodiment of the invention, the head slider 3 mounting the magnetic head, the suspension 154 mounting the head slider 3 at one end thereof and the actuator arm 155 connected to the other end of the suspension 154.

The suspension 154 has a lead for write-in/read-out of signals, a lead for a heater to adjust the flying height and a lead not shown in the figure for the oscillation of the spin torque oscillator, the leads electrically connecting to the respective electrodes of the magnetic head built into the head slider 3. The electrode pads not shown in the figure are provided in the head gimbal assembly 158. Eight electrode pads are provided in this example. That is, the head gimbal assembly 158 is provided with two pads for the coils of the magnetic pole 61, two pads for a magnetic reproducing element 71, two pads for DFH (dynamic flying height), and two pads for electrodes of the spin torque oscillator 10.

A signal processing portion 190 not shown in the figure to perform write-in/read-out of signals for the magnetic recording medium using the magnetic recording head is also provided to the head gimbal assembly 158. The signal processing portion 190 is mounted onto the back side of the drawing of the magnetic recording apparatus 150 illustrated in FIG. 10, for example. Input-output lines are connected to the electrode pads of the head gimbal assembly 158, and electrically combined with the magnetic recording head.

Thus, the magnetic recording apparatus 150 according to this embodiment is provided with the magnetic recording medium, the magnetic recording head, a movable portion, a position control part and a signal processing part, the movable portion enabling the magnetic recording medium and the magnetic recording head to relatively move to each other in separate or in contact condition while making the medium and the head face each other, the signal processing part performing write-in/read-out of signals for the magnetic recording medium.

That is, the recording medium disk 180 is used as the magnetic recording medium mentioned above. The above-mentioned movable portion can include the head slider 3. The above-mentioned position control part can include the head gimbal assembly 158.

That is, the magnetic recording apparatus 150 according to this embodiment is provided with the magnetic recording medium, the magnetic head assembly according to the embodiments of the invention, and the signal processing part that performs writ-in/read-out of signals for the magnetic recording medium using the magnetic recording head mounted onto the magnetic head assembly.

Using the spin torque oscillator and the magnetic recording head according to the embodiments mentioned above allows it to provide a high density magnetic recording apparatus due to the spin torque oscillator with a high in-plane high-frequency magnetic field, the spin torque oscillator being capable of stably causing an oscillation with a low current density and stably feeding a high frequency magnetic field.

In the magnetic recording medium according to the embodiments of the invention, the spin torque oscillator 10 can be provided on the trailing side of the magnetic pole 61. In this case, the magnetic recording layer 81 of the magnetic recording medium 80 firstly faces the spin torque oscillator 10, and secondly faces the magnetic pole 61.

In the magnetic recording apparatus according to the embodiments of the invention, the spin torque oscillator 10 can be provide on the reading side of the magnetic pole 61. In this case, the magnetic recording layer 81 of the magnetic recording medium 80 firstly faces the magnetic pole 61, and then faces the spin torque oscillator 10.

Figure 12A:
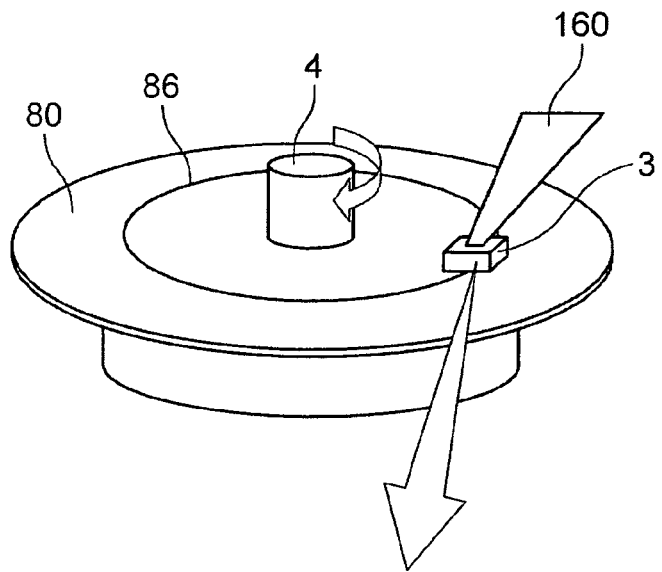
FIGS. 12A and 12B are typical perspective views illustrating configurations of a magnetic recording medium of the magnetic recording apparatus according to the embodiment of the invention.
Figure 12B:
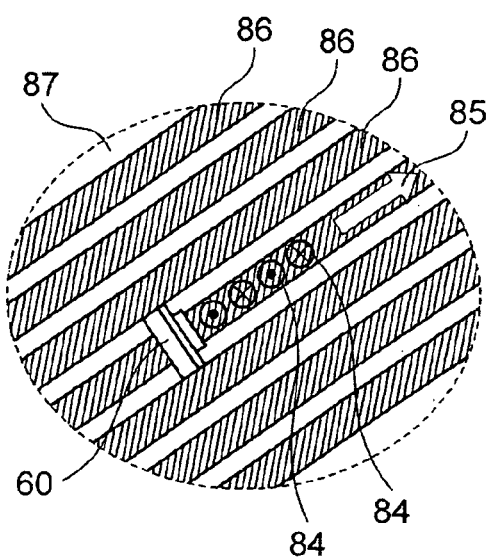

The magnetic recording medium which can be used for the magnetic recording apparatus of the embodiments mentioned above is explained below. FIGS. 12A and 12B are typical perspective views illustrating configurations of the magnetic recording medium of the magnetic recording apparatus according to the embodiment of the invention. As shown in FIGS. 12A and 12B, the magnetic recording medium 80 used for the magnetic recording apparatus according to the embodiment of the invention has magnetic discrete tracks (recording tracks) 86 including processed magnetic particles thereon which are separated from each other by a nonmagnetic material (or air) 87 and have magnetization perpendicularly oriented to the medium surface. When this magnetic recording medium 80 is rotated by the spindle motor 4 and moves in the medium-moving direction 85, one of the magnetic recording heads according to the embodiments mentioned above is arranged in a prescribed position to thereby form recorded regions of magnetization 84. Thus, the magnetic recording medium 80 may be a discrete track medium where the adjacent recording tracks were formed to be separated by the nonmagnetic portions in the magnetic recording medium according to the embodiment of the invention.

The width (TS) of the recording portion facing the recording tracks 86 of the spin torque oscillator 10 is set to the width (TW) of the tracks 86 or larger and the recording track pitch or narrower. This setting allows it to suppress a reduction in the coercive force of the adjacent recording tracks due to a high frequency magnetic stray field from the spin torque oscillator 10. For this reason, in magnetic recording medium 80 of this example, the high frequency magnetic field assist recording can be focused just on a correct track to be recorded.

According to this example, it is easier to realize a narrow track by the high frequency assist recording apparatus rather than to use a perpendicular magnetic recording medium formed of an unprocessed continuous film. According to a conventional magnetic recording method, it was impossible to use FePt, SmCo, etc. as magnetic fine particles, because the magnetic fine particles of FePt, SmCo, etc. with extremely high magnetic anisotropy energy (Ku) were too difficult to switch the magnetization direction thereof, i.e., to write in. However, according to the high frequency magnetic field assist recording method, it is possible to employ the magnetic fine particles of FePt, SmCo, etc. which are reduced even to a nanometer size, and to provide a magnetic recording apparatus capable of attaining a linear recording density much higher than that of the conventional magnetic recording method. The magnetic recording apparatus according to this embodiment can firmly record even on the discrete type magnetic recording medium 80 with a high coercive force, allowing it to attain a high-density and rapid recording.

Figure 13A:
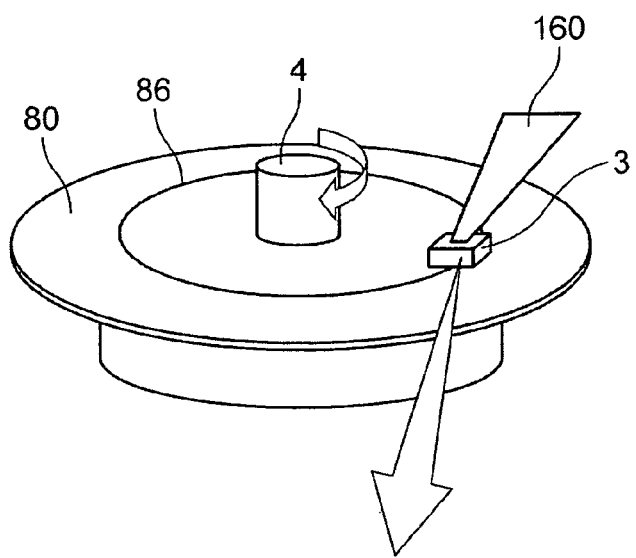
FIGS. 13A and 13B are typical perspective views illustrating configurations of another magnetic recording medium of the magnetic recording apparatus according to the embodiment of the invention.
Figure 13B:
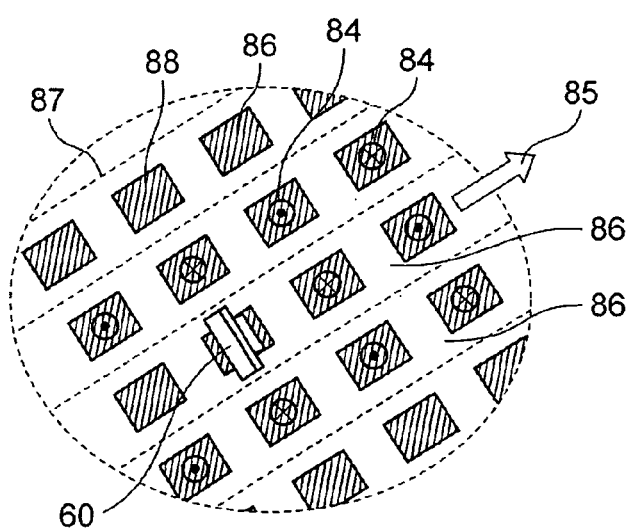

FIGS. 13A and 13B are typical perspective views illustrating configurations of another magnetic recording medium of the magnetic recording apparatus according to the embodiments of the invention. As shown in FIGS. 13A and 13B, another magnetic recording medium 80 which can be employed for the magnetic recording apparatus according to the embodiments of the invention has magnetic discrete bits 88 mutually separated by a nonmagnetic material 87. When this magnetic recording medium 80 is rotated by the spindle motor 4 and moves in the medium-moving direction 85, the magnetic recording head according to the embodiments of the invention is arranged in a prescribed position to thereby form recorded magnetization 84. Thus, the magnetic recording medium 80 may be a discrete bit medium where recording magnetic dots are separated by the nonmagnetic portions to be regularly arranged on the magnetic recording medium according to the embodiments of the invention.

The magnetic recording apparatus according to this embodiment can firmly record even on the discrete type magnetic recording medium 80 with a high coercive force, thereby allowing it to attain a high-density and rapid recording.

The width (TS) of the recording potion facing the recording tracks 86 of the spin torque oscillator 10 is set to the width (TW) of the tracks 86 or larger and the recording track pitch or narrower. This setting allows it to suppress a reduction in the coercive force of the adjacent recording tracks due to a high frequency magnetic stray field from the spin torque oscillator 10. For this reason, in magnetic recording medium 80 of this example, the high frequency magnetic field assist recording can be focused just on the track to be recorded. According to this example, enhancing the anisotropy energy (Ku) and miniaturizing the magnetic discrete bits 88 possibly lead to a high frequency magnetic field assist recording apparatus capable of attaining a high recording density of 10 Tbits/inch$^2$ or more, as long as the heat fluctuation tolerance of the bits 88 is maintained under the environment of usage thereof.

The embodiments of the invention have been explained with reference to the examples. However, the present invention is not limited to these examples. That is, when those skilled in the art appropriately select to combine two or more of the configurations of the spin torque oscillator, the magnetic recording head, the magnetic head assembly, and the magnetic recording apparatus from a known range, and the same effect as described above can be obtained, they are also incorporated in the scope of the present invention.

When those skilled in the art appropriately change or modify the designs of the spin torque oscillator, the magnetic recording head, the magnetic head assembly, and the magnetic recording apparatus to practice all the changed or modified ones, and the same effect as described above can be obtained, they are also incorporated in the present invention.

In addition, those skilled in the art can change or modify the embodiments according to the invention. Then the changed or modified examples can be understood to be incorporated in the scope of the present invention.

What is claimed is:

1. A spin torque oscillator, comprising:
    an amorphous soft magnetic layer;
    a hard magnetic layer having close packing structure and perpendicular magnetic anisotropy; and
    a nonmagnetic layer provided between the soft magnetic layer and the hard magnetic layer, and having close packing structure arranged on the amorphous soft magnetic layer.

2. The oscillator according to claim 1, wherein the amorphous soft magnetic layer includes Fe-Co alloy mainly and Boron not less than 10 percent.

3. The oscillator according to claim 1, further comprising:
    a soft magnetic layer including Fe—Co(Al, Si) alloy which is provided between the amorphous soft magnetic layer and the nonmagnetic layer, wherein a thickness of the soft magnetic layer is 0.5 nanometer or larger and 2 nanometers or smaller.

4. The oscillator according to claim 1, wherein the hard magnetic layer includes CoPt.

5. A magnetic recording head, comprising:
    a spin torque oscillator according to claim 1; and
    a magnetic pole provided near the spin torque oscillator.

6. The magnetic recording head according to claim 5, wherein the coercive force that the amorphous soft magnetic layer and the hard magnetic layer have is smaller than a magnetic field which is applied by the magnetic pole.

7. The magnetic recording head according to claim 6, wherein the amorphous soft magnetic layer is provided between the main pole and the hard magnetic layer.

8. A magnetic head assembly, comprising:
    a magnetic recording head including:
        a spin torque oscillator comprising an amorphous soft magnetic layer, a hard magnetic layer having close packing structure and perpendicular magnetic anisotropy, and a nonmagnetic layer provided between the soft magnetic layer and the hard magnetic layer, and having close packing structure arranged on the amorphous soft magnetic layer;
a magnetic pole provided near the spin torque oscillator;
a head slider installed in the magnetic recording head;
a suspension equipped with the head slider in an end thereof; and
an actuator arm connected with the other end of the suspension.

9. A magnetic recording apparatus, comprising:
a magnetic recording medium;
a magnetic head assembly comprising a magnetic recording head including:
  a spin torque oscillator comprising an amorphous soft magnetic layer, a hard magnetic layer having close packing structure and perpendicular magnetic anisotropy, and a nonmagnetic layer provided between the soft magnetic layer and the hard magnetic layer, and having close packing structure arranged on the amorphous soft magnetic layer;
  a magnetic pole provided near the spin torque oscillator;
  a head slider installed in the magnetic recording head;
  a suspension equipped with the head slider in an end thereof; and
  an actuator arm connected with the other end of the suspension; and
  a signal processing unit configured to write signals on the magnetic recording medium or read out from the magnetic recording medium by using the magnetic recording head.

10. The magnetic recording apparatus according to claim 9, wherein the spin torque oscillator is provided on a trailing side of the magnetic pole.

11. The magnetic recording apparatus according to claim 9, wherein the spin torque oscillator is provided on a leading side of the magnetic pole.

12. The magnetic recording apparatus according to claim 11, wherein the magnetic recording medium is discrete track medium in which adjacent recording tracks are formed via a nonmagnetic member.

13. The magnetic recording apparatus according to claim 11, wherein the magnetic recording medium is discrete bit medium in which adjacent recording dots isolated by a nonmagnetic member are regularly arranged.

* * * * *